(12) United States Patent
Yu et al.

(10) Patent No.: US 10,705,738 B2
(45) Date of Patent: Jul. 7, 2020

(54) METHOD, APPARATUS, STORAGE MEDIUM, AND TERMINAL FOR OPTIMIZING MEMORY CARD PERFORMANCE

(71) Applicant: Shanghai Xiaoyi Technology Co., Ltd., Shanghai (CN)

(72) Inventors: Jinsuo Yu, Shanghai (CN); Xuewu Zhang, Shanghai (CN)

(73) Assignee: SHANGHAI XIAOYI TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 16/035,703

(22) Filed: Jul. 15, 2018

(65) Prior Publication Data

US 2019/0087102 A1 Mar. 21, 2019

(30) Foreign Application Priority Data

Sep. 20, 2017 (CN) .......................... 2017 1 0849708

(51) Int. Cl.
*G06F 3/06* (2006.01)
*H03K 5/14* (2014.01)
(Continued)

(52) U.S. Cl.
CPC .............. *G06F 3/0613* (2013.01); *G06F 1/10* (2013.01); *H03K 3/86* (2013.01); *H03K 5/131* (2013.01);
(Continued)

(58) Field of Classification Search
CPC .......... H03K 3/86; H03K 5/131; H03K 5/135; H03K 5/14; G06F 1/10; G06F 3/0613; G11C 7/222

See application file for complete search history.

(56) References Cited

U.S. PATENT DOCUMENTS 8,649,425 B2 * 2/2014 Seo .................. H04N 5/765
348/143
9,280,291 B2 * 3/2016 Cheng ................ G01R 31/3177
(Continued)

FOREIGN PATENT DOCUMENTS

| CN | 1495666 A | 5/2004 |
| CN | 101315674 A | 12/2008 |
| CN | 104601921 A | 5/2015 |
| CN | 106295432 A | 1/2017 |

OTHER PUBLICATIONS

Extended European Search Report issued in counterpart European Patent Application No. 18195303.5, dated Feb. 12, 2019.
(Continued)

*Primary Examiner* — Vanthu T Nguyen
(74) *Attorney, Agent, or Firm* — Cantor Colburn LLP

(57) ABSTRACT

Embodiments of the disclosure provide a method, apparatus, and computer readable medium for optimizing memory card performance. The method includes: determining a plurality of different preset time intervals, the preset time intervals being determined beginning from clock-cycle starting points; sending test data to a memory card using each of the preset time intervals, respectively; reading from the memory card the test data corresponding to each of the preset time intervals; comparing the test data sent using each of the preset time intervals with the corresponding test data that is read; in response to the sent test data and the read test data being consistent, determining that the preset time interval is valid; determining at least one group of preset time intervals, each of the groups of preset time intervals containing a plurality of valid and successive preset time intervals; determining a group of preset time intervals containing a maximum number of preset time intervals as a target group; determining an average value of all the preset time intervals in the target group as a time interval for writing to the memory card.

15 Claims, 5 Drawing Sheets

(51) Int. Cl.
  *H03K 5/135*  (2006.01)
  *H03K 3/86*   (2006.01)
  *H03K 5/131*  (2014.01)
  *G06F 1/10*   (2006.01)
  *G11C 7/22*   (2006.01)

(52) U.S. Cl.
  CPC ............... *H03K 5/135* (2013.01); *H03K 5/14* (2013.01); *G11C 7/222* (2013.01)

(56) References Cited

U.S. PATENT DOCUMENTS

| | | | |
|---|---|---|---|
| 9,503,064 B2 * | 11/2016 | Cha | ........................ H03K 3/86 |
| 10,025,345 B2 * | 7/2018 | Jeon | .......................... G06F 1/12 |
| 10,191,666 B1 * | 1/2019 | Lewis | ................... G06F 3/0613 |
| 2004/0059916 A1 | 3/2004 | Mizushima et al. | |
| 2012/0259889 A1 | 10/2012 | Dinker et al. | |
| 2012/0294401 A1 * | 11/2012 | Lin | ....................... H04L 7/0041 |
| | | | 375/362 |
| 2014/0101511 A1 | 4/2014 | Strauss et al. | |

OTHER PUBLICATIONS

European First Office Action corresponding to Application No. 18195303.5-1224; dated Dec. 16, 2019.
SIPO First Office Action corresponding to Application No. 201710849708.8; dated Jan. 13, 2020.

\* cited by examiner

METHOD, APPARATUS, STORAGE MEDIUM, AND TERMINAL FOR OPTIMIZING MEMORY CARD PERFORMANCE

CROSS REFERENCE TO RELATED APPLICATION

The disclosure claims the benefits of priority to Chinese Application No. 201710849708.8, filed on Sep. 20, 2017, which is incorporated herein by reference in its entirety.

TECHNICAL FIELD

The present disclosure relates to the field of memory card technology, and more particularly, to a method, apparatus, storage medium, and terminal for optimizing memory card performance.

BACKGROUND

With the rapid development of memory cards, such as Secure Digital (SD) cards, and the rapid upgrading of memory card manufacturers and memory standards, techniques and other aspects may change. Problems, such as reduced compatibility of memory cards, unstable writing to memory cards, slow read and write speeds of memory cards, may occur.

FIG. 1 illustrates a sequence diagram of sending data to an exemplary memory card. A default time interval can be the time interval between a clock-cycle start point and a data-sending time point. Data can be sent at the data-sending time point, which can overlap an end of the default time interval that begins from the clock-cycle start point. If the clock cycle fluctuates or the default time interval is not set properly, then the data-sending time point would not meet the requirement of the memory card, leading to reduced stability and accuracy in the writing of data to the memory card.

SUMMARY

To address the aforementioned technical problem, consistent with embodiments of the present disclosure, there is provided an exemplary method for optimizing memory card performance. The method includes: determining a plurality of different preset time intervals, the preset time intervals being calculated beginning from clock-cycle starting points; sending test data to a memory card using each of the preset time intervals, respectively; reading from the memory card the test data corresponding to each of the preset time intervals; comparing the test data sent using each of the preset time intervals with the corresponding test data that is read, and if they are consistent, then determining that the preset time interval is valid; determining at least one group of preset time intervals, each of the groups of preset time intervals containing a plurality of valid and successive preset time intervals, and determining the group of preset time intervals containing a maximum number of preset time intervals as a target group; determining the average value of all the preset time intervals in the target group as a time interval for writing to the memory card.

Consistent with embodiments of the present disclosure, there is provided an apparatus for optimizing memory card performance. The apparatus includes: a preset-time-interval determining module suitable for determining a plurality of different preset time intervals, the preset time intervals being calculated beginning from the clock-cycle starting points; a sending module suitable for sending test data to a memory card by using each of the preset time intervals respectively; a reading module suitable for reading from the memory card the test data corresponding to each of the preset time intervals; a comparing module suitable for comparing the test data sent using each of the preset time intervals with the corresponding test data that is read, and if they are consistent, then determining that the preset time interval is valid; a target-group determining module suitable for determining at least one group of preset time intervals, each of the groups of preset time intervals containing a plurality of valid and successive preset time intervals, and determining the group of preset time intervals containing a maximum number of preset time intervals as a target group; an average-value determination module suitable for determining an average value of all the preset time intervals in the target group as a time interval for writing to the memory card.

Consistent with embodiments of the present disclosure, there is provided a non-transitory computer readable medium storing a set of instructions that is executable by at least one processor of a computer system to cause the computer system to perform the above method for optimizing memory card performance.

DETAILED DESCRIPTION

Figure 1:
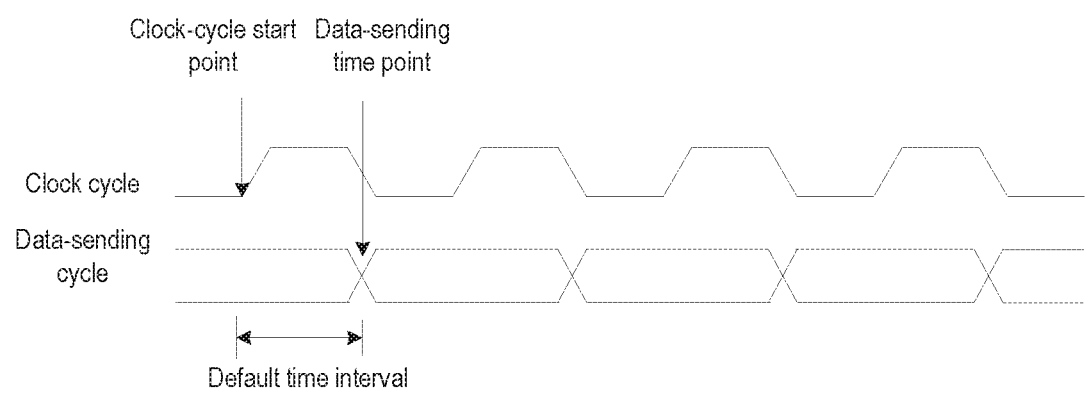
FIG. 1 illustrates a sequence diagram of sending data to an exemplary memory card.

Of the various types of memory cards currently available, Secure Digital (SD) cards can be considered one of the most universally used types on the market. Over time, the storage capacity of these cards has evolved from several megabytes up to a magnitude of terabytes. The speed of the memory cards has increased considerably, and development and upgrading of the memory cards is accelerating.

Transmission speeds sometimes vary significantly among memory cards of SD card manufacturers and brands. A minimum stable write speed can be important for video recording. Therefore, it is difficult to decide which of the many of memory cards offering different write speeds should be selected in order to ensure smooth playback. For that reason, the SD Association has defined speed class specifications and uses two speed symbols for all speeds with the aim of assisting consumers to choose the performance they need via the read and write labels. On the basis of the development of the SD bus, the two types of speed labels are Speed Class and Ultra High Speed (UHS) Speed Class. The two types of speed labels represent the minimum write performance to ensure that dynamic content recordings (e.g., video) can be stored smoothly and at a stable speed.

This can be important for video cameras, camcorders, and other devices having video-recording functionality.

A speed class designates the minimum writing performance to record video, and the SD Association has defined four levels in the Speed Class: Level 2, Level 4, Level 6, and Level 10. The UHS Speed Class is applicable only to product series that belong to the UHS type. The SD Association defines three levels in the UHS Speed Class: Level 1, Level 2, and Level 3.

However, due to the rapid upgrading of SD card manufacturers and SD standards, problems, such as reduced compatibility of SD cards, unstable writing to SD cards, and slow read and write speeds of SD cards, may occur.

The inventor of the present disclosure has discovered through research that in currently available technology, the time interval between the clock-cycle start point and the data-sending time point is a default time interval. Therefore, data can be sent at the end of the default time interval that begins from the clock-cycle start point. If the clock cycle fluctuates or the default time interval is not set properly, then the data-sending time point does not meet the needs of an SD card, leading to reduced stability and accuracy in the writing of data to the SD card.

In embodiments of the present disclosure, a plurality of different preset time intervals can be determined. The preset time intervals can be determined beginning from clock-cycle start points. Test data can be sent to an SD card using each of the preset time intervals, respectively. The test data corresponding to each of the preset time intervals can be read from the SD card. The test data sent using each of the preset time intervals can be compared with the corresponding test data that is read. If the sent test data and the read data are consistent, then the preset time interval is determined to be valid. Generally, at least one group of preset time intervals can be determined, and each of the groups of preset time intervals can contain a plurality of valid and successive preset time intervals. A group of preset time intervals containing the maximum number of preset time intervals can be a target group. The average value of all the preset time intervals in the target group can be determined as the time interval for writing to the SD card.

Therefore, the determined time interval can be more appropriate for writing or reading data, and thus increasing stability and accuracy in writing or reading data of the SD card.

Detailed descriptions of embodiments of the present disclosure are provided below with reference to the attached drawings.

Figure 2:
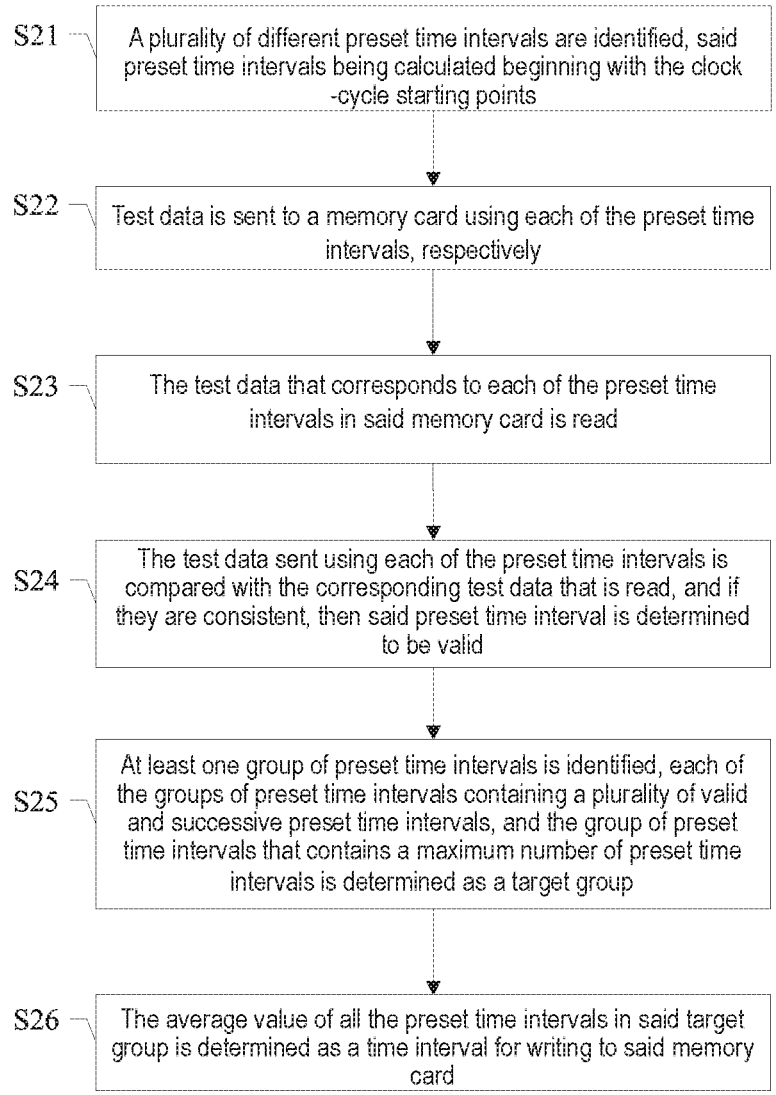
FIG. 2 is a flowchart of an exemplary method for optimizing memory card performance, according to embodiments of the present disclosure.

FIG. 2 is a flowchart of an exemplary method for optimizing memory card performance in embodiments of the present disclosure. The memory card can be an SD card. The method for optimizing memory card performance may include steps S21-S26:

In step S21, a plurality of different preset time intervals can be determined, the preset time intervals beginning with the clock-cycle start points.

In step S22, test data can be sent to a memory card using each of the preset time intervals, respectively.

In step S23, the test data corresponding to each of the preset time intervals can be read from the memory card;

In step S24, the test data sent using each of the preset time intervals can be compared with the corresponding data that is read. If the sent data and the read data are consistent, then the preset time interval can be determined to be valid.

In step S25, at least one group of preset time intervals can be determined. Each of the groups of preset time intervals can contain a plurality of valid and successive preset time intervals. And a group of preset time intervals containing a maximum number of preset time intervals can be determined as a target group.

In step S26, the average value of the preset time intervals in the target group can be determined as a time interval for writing to the memory card.

In step S21, a plurality of different preset time intervals may be obtained by adding or subtracting one or a plurality of preset time step sizes to or from a default time interval, or a plurality of different preset time intervals may be set in advance.

With reference back to FIG. 1, in a plurality of clock cycles, each of the preset time intervals can be determined beginning from the clock-cycle start point in which the preset time interval falls.

A plurality of preset time intervals may be obtained by adding or subtracting one or a plurality of preset time step sizes to or from a default time interval. For example, the default time interval may be set at 5 milliseconds (ms), the preset time step size may be set at 0.1 ms, and the plurality of different preset time intervals may be 4.8 ms, 4.9 ms, 5 ms, 5.1 ms, 5.2 ms, and 5.3 ms. It is appreciated that the above six preset time intervals are merely an example for the purpose of illustration, and there is no limitation on the specific number of preset time intervals in example embodiments of the present disclosure.

In step S22, test data can be sent to a memory card using each of the preset time intervals, respectively, to write data to the memory card.

A preset time interval can be selected for sending data once in a single clock cycle.

Furthermore, random data having a preset length may be attached before the test data. In some embodiments, to ensure that the content of one or a plurality of files written to a memory card is different each time, random data having a preset length can be generated when data is being written. For example, the length may be 512 kilobytes.

Furthermore, each set of test data may contain a plurality of sub sets. In some embodiments, two or more data files may be opened in the memory card for simultaneous writing so as to increase the likelihood of an error, in order to increase the robustness of the final time interval determined in an application.

In embodiments of step S23, the test data that has been written into the memory card can be read, and the test data can correspond to one of the preset time intervals. Therefore, the test data written using a plurality of preset time intervals can be read separately.

In embodiments of step S24, correctness of the written data can be examined by comparing the test data sent using each of the preset time intervals with the corresponding read test data.

If the sent test data and the read test data are consistent, then it is proven that the data has been correctly written, and thus the preset time interval is determined to be valid. If the sent test data and the read test data are inconsistent, then it can be determined that the preset time interval may lead to a write failure.

In embodiments of step S25, a target group can be identified by determining groups of preset time intervals containing a plurality of valid and successive preset time intervals, in order to determine one or a plurality of time intervals associated with stable read and write speeds.

For example, to determine valid and successive preset time intervals, the plurality of different preset time intervals may be sorted by length. For example, the order of the plurality of different preset time intervals can be 4.8 ms, 4.9 ms, 5 ms, 5.1 ms, 5.2 ms, and 5.3 ms. Then the validity of each of the preset time intervals can be marked, and a plurality of groups of valid and successive preset time intervals can be determined. Here, "successive" refers to the back-to-back sequential line-up of two or more preset time intervals after the preset time intervals are sorted according to their lengths (from shortest to longest or from longest to shortest).

In one example, 4.8 ms, 4.9 ms, and 5 ms are valid, 5.1 ms is invalid, and 5.2 ms and 5.3 ms are valid. Thus a first group of preset time intervals may include 4.8 ms, 4.9 ms, and 5 ms, and a second group of preset time intervals may include 5.2 ms and 5.3 ms.

Furthermore, a group of preset time intervals that contains a maximum number of preset time intervals can be determined as a target group. Of the aforementioned two groups of preset time intervals, the first group of preset time intervals may be selected as the target group.

It is appreciated that when each of a plurality of groups of preset time intervals contains the maximum number of valid and successive preset time intervals, any one of the groups of preset time intervals may be selected as the target group.

In embodiments of step S26, the average value of all the preset time intervals in the target group may be determined by calculation. The time interval can be stable after fluctuation remaining within a valid range in the event of clock fluctuation.

It is appreciated that, the aforementioned method for optimizing memory card performance may be configured to run automatically at the startup of the device or upon hot plugging of a card, and may also be configured for optimization according to a user's instruction, e.g. one-click optimization.

It is appreciated that, before implementing the aforementioned method for optimizing memory card performance, disconnecting the memory card from its power source and initializing the memory card may ensure that the memory card begins operation from its default state.

For example, disconnecting the memory card from its power source may be: configuring a register of the processor to operate an input/output (I/O) interface to disconnect the memory card from its power source. Therefore, the memory card begins operating from the state it is in after having been plugged in. The step of initializing the memory card may be the default configuration of the memory card state. The step of initializing may, for example, include commands, such as resetting the memory card (through Command 0, also called CMD0), obtaining the memory card's protocol version number and interface type (CMD8), obtaining whether the memory card supports UHS (CMD41), and CMD3, CMD9, CMD7, and CMD13.

In some embodiments, before initializing the memory card, a step of configuring memory card parameters may also be included. For example, a plurality of parameters including memory card parameters can be configured by means of configuring the register of the processor. The parameters may include, for example: clock, clock polarity, sampling edge rising time and falling time, and other parameters.

In embodiments of the present disclosure, data can be written to and read from a memory card on the basis of a plurality of different preset time intervals, so that one or more valid time intervals can be determined. And a target group can be further determined by means of determining groups of preset time intervals containing a plurality of valid and successive preset time intervals. The average value of all the preset time intervals in the target group can be determined as the time interval for writing to the memory card. Therefore, the time interval can be more appropriate for writing data, and thus increasing stability and accuracy in writing data to the memory card. Furthermore, as the error rate is decreased, the total write time can also be reduced and write efficiency can be improved.

Figure 3:
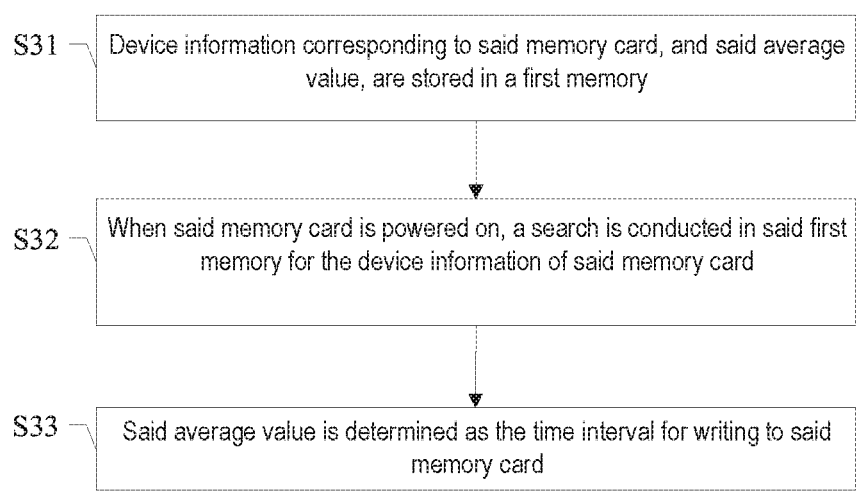
FIG. 3 is a partial flowchart of another exemplary method for optimizing memory card performance, according to embodiments of the present disclosure.

FIG. 3 is a partial flowchart of another exemplary method for optimizing performance of a memory card, such as an SD card, according to embodiments of the present disclosure. This method for optimizing memory card performance may include steps S21 through S26 as illustrated in FIG. 2, and may further include steps S31 through S33.

In step S31, the average value and the device information corresponding to the memory card can be stored in a first storage device.

In some embodiments, the device information is used for identifying the memory card. For example, whether the user is operating a same memory can be determined, a set of memories having a same model number can be determined, or a set of memory cards processed on a same production line can be determined. In embodiments of the present disclosure, no limitation is placed on whether the same series of memory cards can use the same time intervals for writing to the memory cards.

In some embodiments, the device information may include at least one of: a device number, an original equipment manufacturer number, and a product name.

The device number may be used for representing the manufacturer identification (MID) or brand name. The original equipment manufacturer number may be used for representing the original equipment manufacturer identification (OD). And the product name may be used for determining the common name for a series of products to which a memory card belongs or the product name of the memory card itself.

In step S32, when the memory card is powered on (for example, at device startup or upon hot-plugging), a search is conducted in the first storage device for the device information of the memory card. If an average value corresponding to the device information exists, then it can be determined that the memory card or a memory card of the same series has already been optimized, and the average value can thus be obtained directly.

In step S33, in the event that the memory card or a memory card of the same series has previously been optimized, the average value may be obtained directly and the average value can be determined as the time interval for writing to the memory card.

In some embodiments, after the time interval for writing to the memory card is determined, the average value and the device information corresponding to the memory card may be stored in a first storage device. Therefore, when the memory card is powered on, device information of the memory card can be used directly by means of searching and do not need to be determined again. Thus, convenience for the user can be increased.

Figure 4:
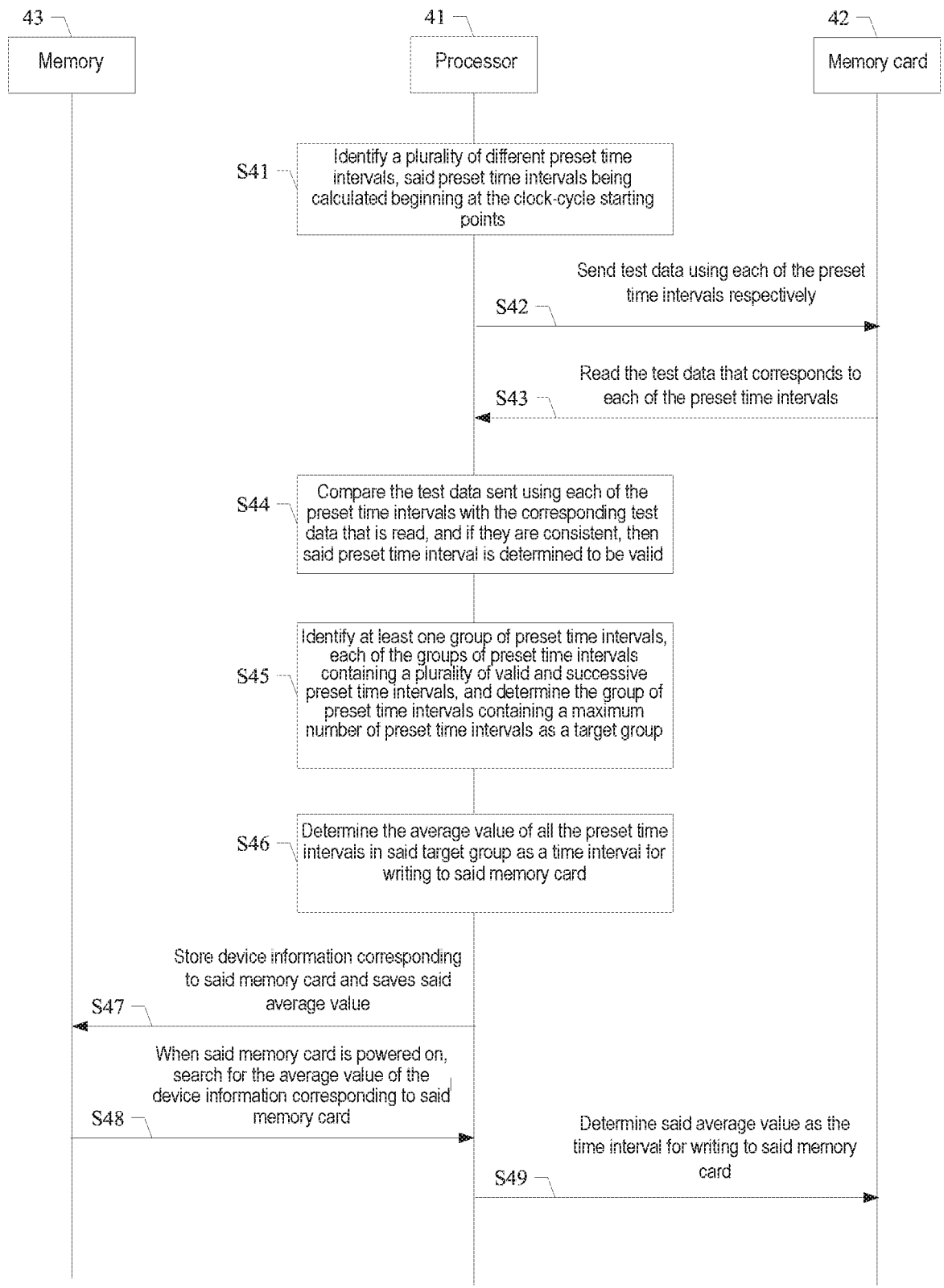
FIG. 4 is a flowchart of another exemplary method for optimizing memory card performance, according to embodiments of the present disclosure.

FIG. 4 is a flowchart of another exemplary method for optimizing memory card performance, according to embodiments of the disclosure. This method for optimizing memory card performance may include steps S41 through S49.

In step S41, a processor 41 can determine a plurality of different preset time intervals, and the preset time intervals can be determined beginning from clock-cycle starting points.

In step S42, the processor 41 can send test data to a memory card 42 using each of the preset time intervals, respectively.

In step S43, the processor 41 can read from the memory card the test data corresponding to each of the preset time intervals 42.

In step S44, the processor 41 can compare the test data sent using each of the preset time intervals with the corresponding test data that is read, and if the sent test data and the read test data are consistent, then determine that the preset time interval is valid.

In step S45, the processor 41 can determine at least one group of preset time intervals. Each of the groups of preset time intervals can contain a plurality of valid and successive preset time intervals, and the group of preset time intervals containing a maximum number of preset time intervals can be determined as a target group.

In step S46, the processor 41 can determine an average value of all the preset time intervals in the target group as the time interval for writing to the memory card.

In step S47, the processor 41 can store the device information corresponding to the memory card and stores the average value in a storage device 43.

In step S48, when the memory card is powered on, the processor 41 can search in the storage device 43 for the average value of the device information corresponding to the memory card.

In step S49, the processor 41 can use the searched average value as the time interval for writing to the memory card.

For more detailed descriptions of steps S41 through S49, please refer to the descriptions of the steps illustrated in FIGS. 1 and 2. No redundant descriptions will be detailed here.

Figure 5:
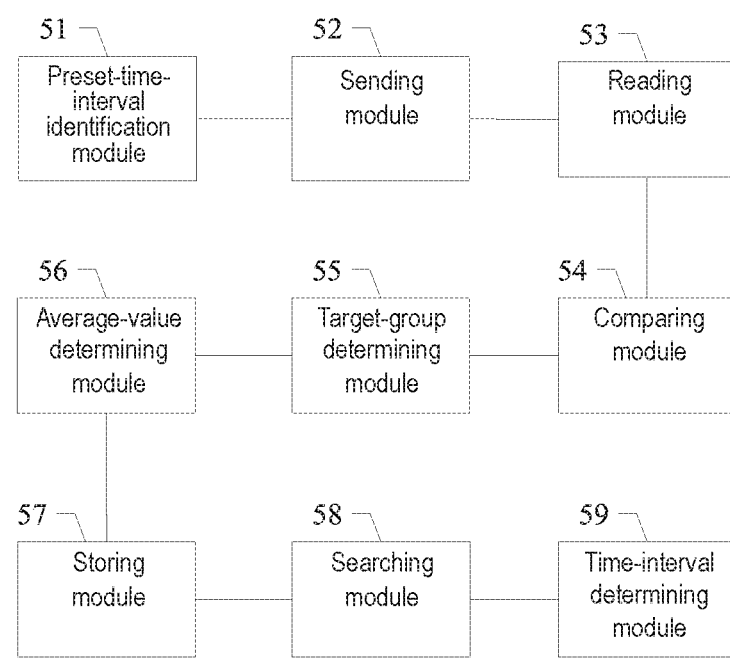
FIG. 5 illustrates a structural diagram of an exemplary apparatus for optimizing memory card performance, according to embodiments of the present disclosure.

FIG. 5 illustrates a structural diagram of an apparatus for optimizing performance of a memory card, such as an SD card, according to embodiments of the present disclosure. The apparatus for optimizing memory card performance may include a preset-time-interval determining module 51, a sending module 52, a reading module 53, a comparing module 54, a target-group determining module 55, an average-value determining module 56, a storing module 57, a searching module 58, and a time-interval determining module 59.

The preset-time-interval determining module 51 can be configured for determining a plurality of different preset time intervals, the preset time intervals being calculated beginning from the clock-cycle starting points.

The sending module 52 can be configured for sending test data to a memory card by using each of the preset time intervals respectively.

The reading module 53 can be configured for reading from the memory card the test data corresponding to each of the preset time intervals.

The comparing module 54 can be configured for comparing the test data sent using each of the preset time intervals with the corresponding test data that is read, and if the sent test data and the read test data are consistent, then determining that the preset time interval is valid.

The target-group determining module 55 can be configured for determining at least one group of preset time intervals, and each of the groups of preset time intervals can contain a plurality of valid and successive preset time intervals. The target-group determining module 55 can further determine the group of preset time intervals containing the maximum number of preset time intervals as a target group.

The average-value determining module 56 can be configured for determining an average value of all the preset time intervals in the target group as the time interval for writing to the memory card.

The storing module 57 can be configured for storing the device information corresponding to the memory card and storing the average value into a first storage device.

The searching module 58 can be configured for searching, when the memory card is powered on, in the first storage device for the average value of the device information corresponding to the memory card.

The time-interval determining module 59 can be configured for using the searched average value as the time interval for writing to the memory card.

Furthermore, each of the preset time intervals may be obtained by adding or subtracting one or a plurality of preset time step sizes to or from a default time interval.

The device information may include at least one of a device number, an original equipment manufacturer number, and a product name.

Random data having a preset length may be attached before the test data.

Each test data set may contain a plurality of sub data sets.

For more details of specific implementation and benefits of the apparatus for optimizing memory card performance, please refer to the relevant descriptions of the method for optimizing memory card performance in the foregoing text and FIGS. 2-4. No redundant descriptions will be detailed here.

In embodiments of the present disclosure, when the average value and the device information corresponding to the memory card are stored in a first storage device, a header and parameter information may also be stored.

For example, the process for storing parameters may include: writing data to a NAND according to a data structure. Therefore, the correctness of the data can be ensured when the data is being stored and retrieved. The stored information can include a header and a data block for the parameter information.

The header may include a magic code. The magic code can be used for storing a number of data blocks in the current write and an index of the current write.

The data block of the stored information may include a data block magic code. The data block magic code can be used to analyze the obtained optimum parameters.

When data is being written, the number of data blocks may be obtained through the header. Then the data blocks can be traversed. If data blocks matching the MID, OID, and product name to be written are found, the content of the data blocks can be updated. Otherwise, a new data block can be added and written into a NAND.

Furthermore, after device startup or hot-plugging of a memory card, such as an SD card, the processor obtaining the determined time interval from the storage device and configuring the controller of the memory card according to the optimized parameters may further include a step of starting up/hot-plugging, a step of configuring the memory card at low speed, a step of traversing the list of stored parameters, and a step of configuring memory card parameters In the step of starting up/hot-plugging, after the memory card is plugged in and after the plug-in action is detected, power can be turned on for the memory card.

In the step of configuring the memory card at low speed, when the memory card has been powered on, the memory card controller may configure the memory card at a low speed, obtain the supply voltage to the memory card, determine whether UHS and the like are supported (CMD41), and obtain the MID, OID, product name (CMD2), and other information of the card.

In the step of traversing the list of stored parameters, information such as MID, OID, and product name can be unique identifiers for determining a single memory card or a series of memory cards. According to the aforementioned information, a search is conducted for the parameters (MID, OID, and product name) stored in a NAND, the number of data blocks is obtained by means of the header, and the data blocks are traversed in search of a match between the MID, OID, and product name of the current card and the MID, OID, and product name stored in the NAND. If no matching information is found, it can be determined that no record of the parameters for the card exists, and the default parameters can be used to configure or optimize the memory card.

In the step of configuring memory card parameters, configuration can be performed according to the memory card parameters (clock, polarity, and sampling edge) obtained from the traverse.

The memory card can be configured at high speed. For example, after completing the configuration of the memory card parameters, the memory card can use the new parameters for configuration, reading, and writing.

Embodiments of the present disclosure can further provide a non-transitory computer readable medium that stores a set of instructions that is executable by at least one processor of a computer system to cause the computer system to perform the above method for optimizing memory card performance. The non-transitory computer readable medium may include a compact disk, a mechanical hard disk drive, a solid-state drive, and the like.

Embodiments of the present disclosure further provides a terminal, including a second storage device and a processor. The second storage device can store a computer instruction that can be run on the processor, the steps of the aforementioned method for optimizing memory card performance being executed when the processor runs the computer instruction.

It is appreciated that, the second storage device and the first storage device may use a same storage device, e.g. a NAND flash memory. The first storage device and second storage device may be integrated into the terminal or externally connected to the terminal.

In embodiments of the present disclosure, data can be written to and read from a memory card on the basis of a plurality of different preset time intervals in order to determine one or a plurality of valid time intervals, and a target group is further determined by means of determining groups of preset time intervals containing a plurality of valid and successive preset time intervals, and the average value of all the preset time intervals in the target group is taken to be the time interval for writing to the memory card. Embodiments of the present disclosure can determine a proper time interval for sending data to a memory card, thereby making the time interval more appropriate for writing data and thus increasing stability and accuracy in writing data to the memory card.

Furthermore, in embodiments of the present disclosure, after the time interval for writing to the memory card is determined, the average value of all the preset time intervals and the device information corresponding to the memory card may be stored in a first storage device so that when the memory card is powered on, they can be used directly by means of searching and do not need to be determined again. Thus, convenience for the user is increased.

Notwithstanding the foregoing disclosure of the present invention, the present invention is not limited by the disclosure. Any person skilled in the art may make various alterations and changes which do not depart from the spirit and scope of the present invention. Therefore, the scope of protection for the present invention should be that as defined by the claims.

What is claimed is:

1. A method for optimizing memory card performance, comprising:
   determining a plurality of different preset time intervals, the preset time intervals being determined beginning from clock-cycle starting points;
   sending test data to a memory card using each of the preset time intervals, respectively;
   reading from the memory card the test data corresponding to each of the preset time intervals;
   comparing the test data sent using each of the preset time intervals with the corresponding test data that is read;
   in response to the sent test data and the read test data being consistent, determining that the preset time interval is valid;
   determining at least one group of preset time intervals, each of the groups of preset time intervals containing a plurality of valid and successive preset time intervals;
   determining a group of preset time intervals containing a maximum number of preset time intervals as a target group; and
   determining an average value of all the preset time intervals in the target group as a time interval for writing to the memory card.

2. The method for optimizing memory card performance according to claim 1, wherein each of the preset time intervals is obtained by adding or subtracting one or more preset time step size to or from a default time interval.

3. The method for optimizing memory card performance according to claim 1, further comprising: storing device information corresponding to the memory card and storing the average value into a first storage device.

4. The method for optimizing memory card performance according to claim 3, further comprising: in response to the memory card being powered on, searching in the first storage device for the average value of the device information corresponding to the memory card; determining the average value as the time interval for writing to the memory card.

5. The method for optimizing memory card performance according to claim 3, wherein the device information comprises at least one of a device number, an original equipment manufacturer number, and a product name.

6. The method for optimizing memory card performance according to claim 1, wherein random data having a preset length is attached in front of the test data.

7. The method for optimizing memory card performance according to claim 1, wherein each set of test data contains a plurality of sub data sets.

8. An apparatus for optimizing memory card performance, comprising:
   a preset-time-interval determining module configured to determine a plurality of different preset time intervals, the preset time intervals being determined beginning from the clock-cycle starting points;
   a sending module configured to send test data to a memory card by using each of the preset time intervals respectively;
   a reading module configured to read from the memory card the test data corresponding to each of the preset time intervals;
   a comparing module configured to compare the test data sent using each of the preset time intervals with the corresponding test data that is read, and in response to the sent test data and the read test data being consistent, then determining that the preset time interval is valid;

a target-group determining module configured to determine at least one group of preset time intervals, each of the groups of preset time intervals containing a plurality of valid and successive preset time intervals, and determine a group of preset time intervals containing a maximum number of preset time intervals as a target group; and an average-value calculating module configured to determine an average value of all the preset time intervals in the target group as a time interval for writing to the memory card.

9. The apparatus for optimizing memory card performance according to claim 8, wherein each of the preset time intervals is obtained by adding or subtracting one or more preset time step size to or from a default time interval.

10. The apparatus for optimizing memory card performance according to claim 8, further comprising a storing module configured to store the average value and the device information corresponding to the memory card into a first storage device.

11. The apparatus for optimizing memory card performance according to claim 10, further comprising: a searching module configured to search, in response to the memory card being powered on, in the first storage device for the average value of the device information corresponding to the memory card; a time-interval determining module configured to determine the average value as the time interval for writing to the memory card.

12. The apparatus for optimizing memory card performance according to claim 10, wherein the device information comprises at least one of a device number, an original equipment manufacturer number, and a product name.

13. The apparatus for optimizing memory card performance according to claim 8, wherein random data having a preset length is attached in front of the test data.

14. The apparatus for optimizing memory card performance according to claim 8, wherein each set of test data contains a plurality of sub data sets.

15. A non-transitory computer readable medium storing a set of instructions that is executable by at least one processor of a computer system to cause the computer system to perform a method for optimizing memory card performance, the method comprising:

determining a plurality of different preset time intervals, the preset time intervals being determined beginning from clock-cycle starting points;

sending test data to a memory card using each of the preset time intervals, respectively; reading from the memory card the test data corresponding to each of the preset time intervals;

comparing the test data sent using each of the preset time intervals with the corresponding test data that is read;

in response to the sent test data and the read test data being consistent, determining that the preset time interval is valid;

determining at least one group of preset time intervals, each of the groups of preset time intervals containing a plurality of valid and successive preset time intervals;

determining a group of preset time intervals containing a maximum number of preset time intervals as a target group;

determining an average value of all the preset time intervals in the target group as a time interval for writing to the memory card.

* * * * *